(12) United States Patent
Kim

(10) Patent No.: US 7,342,412 B2
(45) Date of Patent: Mar. 11, 2008

(54) DEVICE FOR CONTROLLING ON DIE TERMINATION

(75) Inventor: Kyung-Hoon Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 53 days.

(21) Appl. No.: 11/477,539

(22) Filed: Jun. 30, 2006

(65) Prior Publication Data
US 2007/0126468 A1  Jun. 7, 2007

(30) Foreign Application Priority Data
Sep. 29, 2005 (KR) ............. 10-2005-0091520

(51) Int. Cl.
*H03K 19/003* (2006.01)
(52) U.S. Cl. .................................. 326/30; 326/28
(58) Field of Classification Search ............ 326/26–28, 326/30
See application file for complete search history.

(56) References Cited

U.S. PATENT DOCUMENTS 6,420,899 B1 * 7/2002 Crittenden et al. ........... 326/30
6,928,007 B2    8/2005 Jin
7,019,555 B2 *  3/2006 Lee ............................. 326/30
2004/0100837 A1  5/2004 Lee
2004/0240298 A1 12/2004 Jin
2005/0212551 A1  9/2005 So et al.
2005/0225353 A1 10/2005 Kwon

FOREIGN PATENT DOCUMENTS

JP       2004-310981       11/2004

* cited by examiner

*Primary Examiner*—James H. Cho
(74) *Attorney, Agent, or Firm*—McDermott Will & Emery LLP

(57) ABSTRACT

An on die termination (ODT) control device includes a latency block for buffering an ODT control signal to output a latency control signal by selecting one of a plurality of intermediate control signals, which are generated by sequentially delaying the buffered ODT control signal in synchronization with an internal clock, based on first latency information; an enable signal generation block for comparing a first control signal with a second control signal in response to the latency control signal to thereby produce an ODT enable signal based on the compared result; and an ODT block for controlling a termination impedance based on the ODT enable signal.

22 Claims, 6 Drawing Sheets

DEVICE FOR CONTROLLING ON DIE TERMINATION

TECHNICAL FIELD

The present invention relates to a device for controlling an on die termination (ODT); and, more particularly, to an ODT control device for determining an active period of an ODT circuit by using latency information.

BACKGROUND

Recently, various new technologies have been developed for improving data transferring speed of a double data rate (DDR) memory device. For instance, an off chip driver (OCD) calibration technology has been introduced to a specification of the DDR memory device by the JEDEC (Joint Electron Engineering Council) in order to adjust an impedance of a data output unit of the DDR memory device.

The optimum impedance of a data output driver for a current system is detected by measuring a voltage or a current which flows from an external circuit such as a chip set to the data output driver so that an impedance of the data output driver is adjusted to the optimum impedance. For this purpose, a DDR2 synchronous semiconductor memory device additionally includes an OCD control device for adjusting an impedance of the data output driver.

A termination impedance is needed for stably transferring a signal between circuits. If the termination impedance is not appropriately matched, a signal reflection error can occur, i.e., a transferred signal can be reflected back. However, if an external fixed resistor is provided, an appropriate matching may not be obtained due to aging of an integrated circuit, temperature variations or manufacturing process variations.

Therefore, a technology for adjusting the termination impedance has been developed in order to obtain an impedance match with an external reference impedance by controlling the number of turned-on transistors among a plurality of transistors connected in parallel.

FIG. 1 is a block diagram showing a conventional on-die termination (ODT) control device.

As shown, the conventional ODT control device includes an input buffer 10, a domain crossing block 20, a plurality of ODT blocks 30 and a plurality of terminal resistors 40.

The input buffer 10 performs a buffering operation of an ODT control signal ODT to output the buffered signal as an ODT command signal ODT_CMD.

The domain crossing block 20 receives the ODT command signal ODT_CMD to output an ODT enable signal ODT_EN to the plurality of ODT blocks 30 in synchronization with an output clock OCLK.

Accordingly, the plurality of ODT blocks 30 selectively connect the terminal resistors 40 to a power supply voltage terminal VDDQ or a ground voltage terminal VSSQ by using a plurality of switches SW1 and SW2 connected in parallel. As a result, it is possible to control a termination impedance of a semiconductor memory device.

The domain crossing block 20 generates the ODT enable signal ODT_EN in synchronization with the output clock OCLK which is uniform regardless of clock frequency. If the clock frequency of the semiconductor memory device grows shorter, it is difficult to control an active period of the ODT enable signal ODT_EN corresponding to the shortened clock frequency. As a result, the conventional ODT control device cannot accurately measure the termination impedance of the semiconductor memory device.

SUMMARY OF THE INVENTION

It is, therefore, an object of the present invention to provide an on die termination (ODT) control device for determining an active period of an ODT circuit by using latency information to thereby flexibly control a termination impedance of the ODT circuit.

In accordance with an aspect of the present invention, there is provided an on die termination (ODT) control device, including: a latency block for buffering an ODT control signal to output a latency control signal by selecting one of a plurality of intermediate control signals, which are generated by sequentially delaying the buffered ODT control signal in synchronization with an internal clock, based on first latency information; an enable signal generation block for comparing a first control signal with a second control signal in response to the latency control signal to thereby produce an ODT enable signal based on the compared result; and an ODT block for controlling a termination impedance based on the ODT enable signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF THE INVENTION

Hereinafter, an on die termination (ODT) control device in accordance with the present invention will be described in detail referring to the accompanying drawings.

Figure 1:
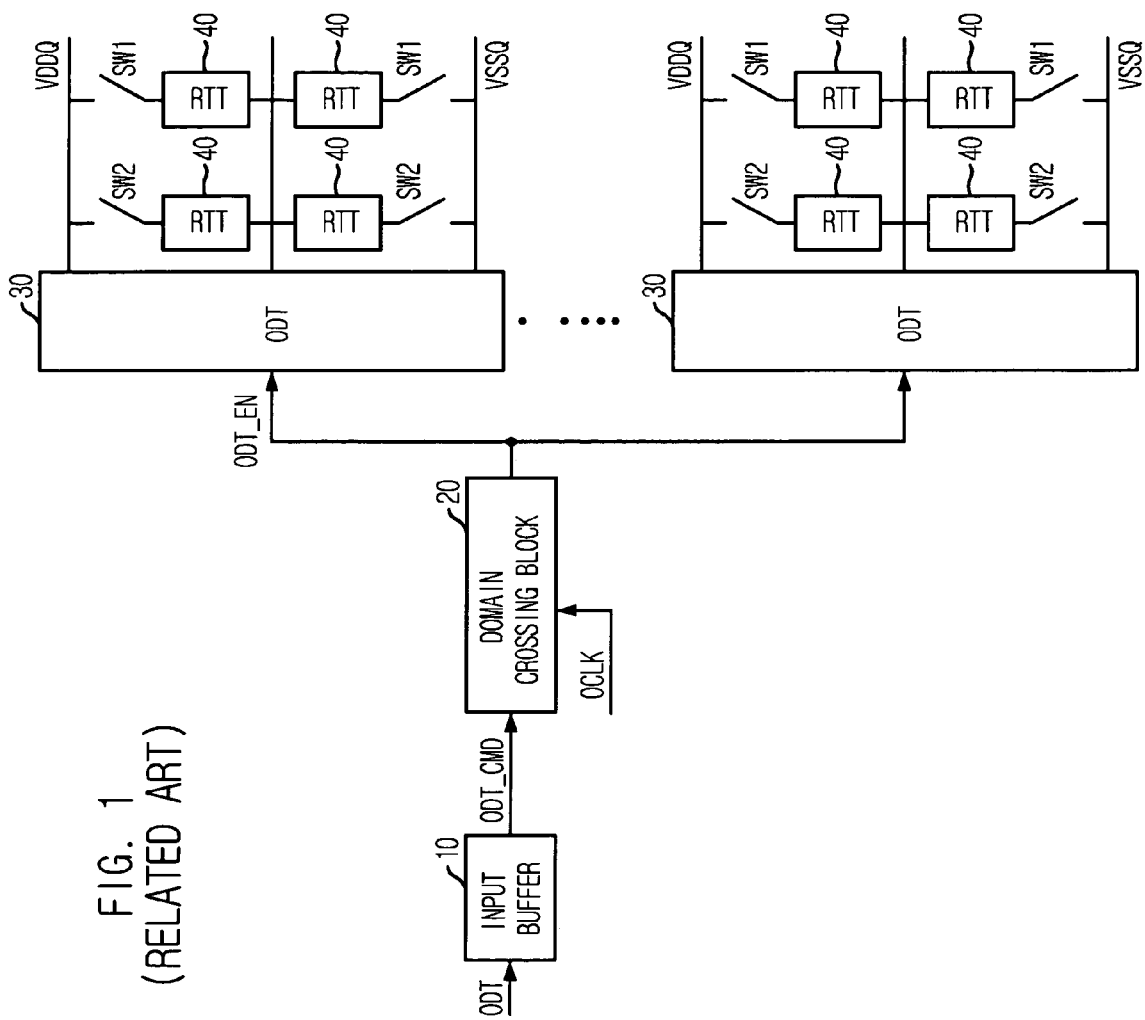
FIG. 1 is a block diagram showing a conventional on die termination (ODT) control device.
Figure 2:
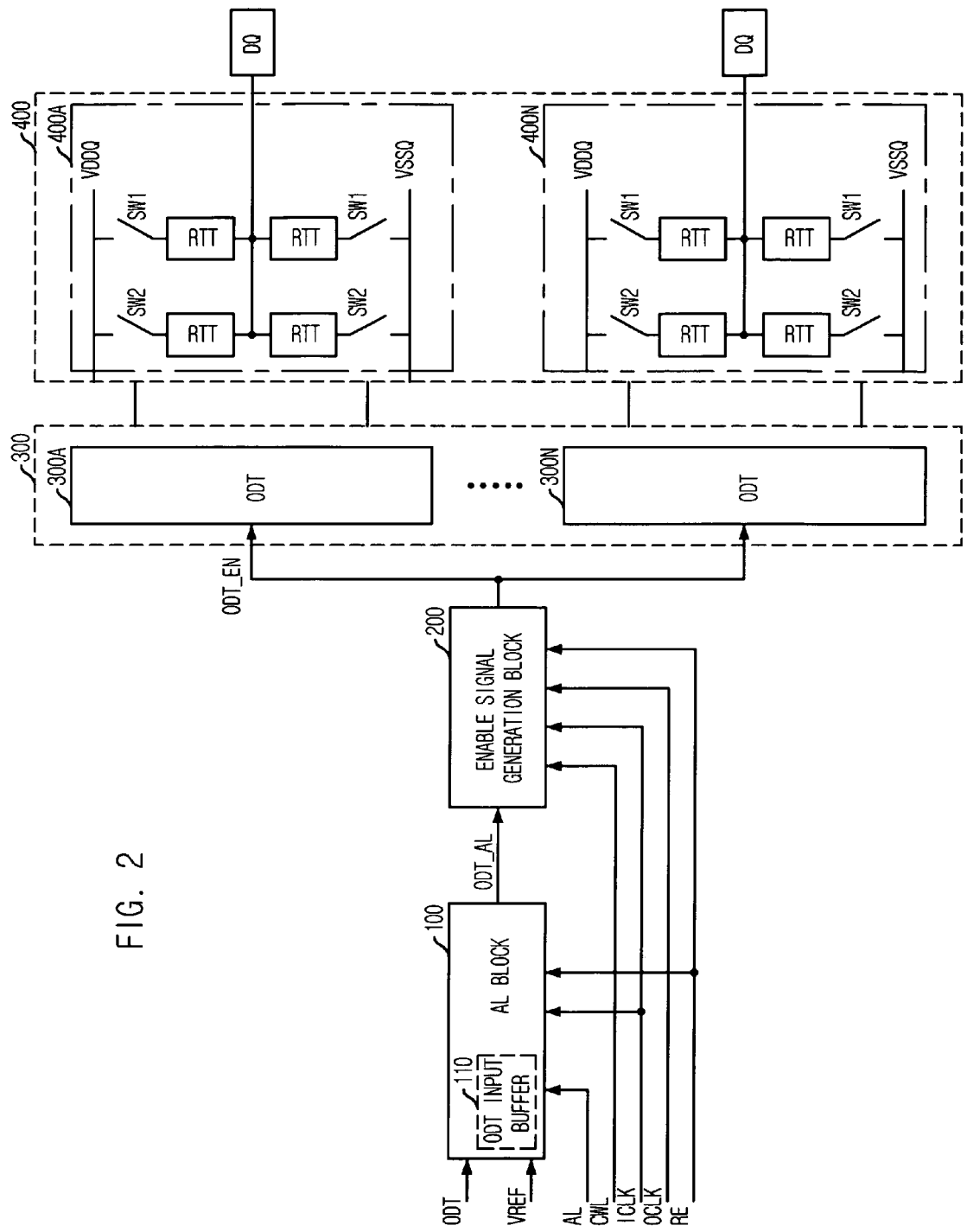
FIG. 2 is a block diagram showing an ODT control device in accordance with an embodiment of the present invention.

FIG. 2 is a block diagram showing an ODT control device in accordance with an embodiment of the present invention.

The ODT control device includes an additive latency (AL) block 100, an enable signal generation block 200, an ODT block 300 and a termination resistor block 400.

The AL block 100 performs a buffering operation of an ODT control signal ODT and a reference voltage VREF and receives an additive latency signal AL, an internal clock ICLK and a reset signal RE to generate a latency control signal ODT_AL. The additive latency signal AL defines how many clocks are required from a point of loading a read command or a write command to a point of recognizing them during a read or a write operation.

The enable signal generation block 200 receives the latency control signal ODT_AL, a column address strobe (CAS) latency signal CWL, the internal clock ICLK, an output clock OCLK and the reset signal RE to output an ODT enable signal ODT_EN to the ODT block 300. The CAS latency signal CWL is an index showing a waiting time of a column address strobe (CAS) signal.

The ODT block 300 includes a plurality of unit ODT blocks, e.g., 300A to 300N, and the termination resistor block 400 includes a plurality of unit termination resistor blocks, e.g., 400A to 400N. Each unit termination resistor block includes a plurality of termination resistors RTT and a plurality of switches SW1 and SW2. A unit ODT block in ODT block 300 selectively connects the plurality of termination resistors RTT in a corresponding unit termination resistor block of termination resistor block 400 to a power supply voltage terminal VDDQ or a ground voltage terminal VSSQ by using a plurality of switches SW1 and SW2 connected in parallel. As a result, it is possible to control a termination impedance of an ODT circuit.

Figure 3:
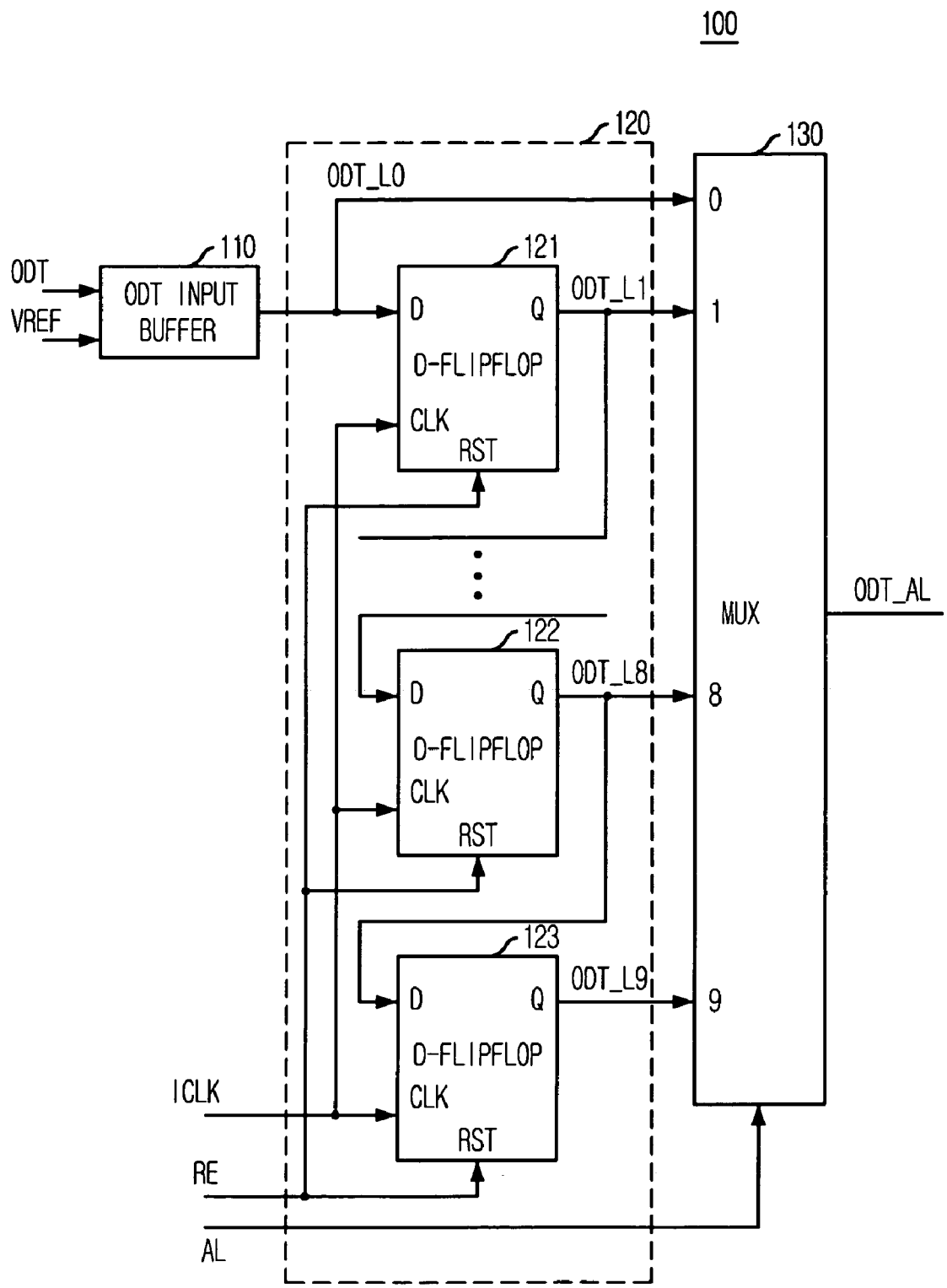
FIG. 3 is a detailed block diagram depicting an additive latency (AL) block shown in FIG. 2.

FIG. 3 is a detailed block diagram depicting the additive latency (AL) block 100 shown in FIG. 2.

The AL block 100 includes an ODT input buffer 110, a latency control unit 120 and a latency selection unit 130.

The ODT input buffer 110 performs the buffering operation of the ODT control signal ODT and the reference voltage VREF to output a first intermediate control signal ODT_L0 to the latency control unit 120.

The latency control unit 120 includes a plurality of D-flip flops, i.e., 121, 122 and 123. A first D-flip flop 121 latches the first intermediate control signal ODT_L0 to output the latched signal as a second intermediate control signal ODT_L1 to the latency selection unit 130 in synchronization with the internal clock ICLK. Likewise, the other D-flip flops, e.g., 122 and 123, receive an intermediate control signal outputted from a previous D-flip flop, e.g., eighth and ninth intermediate control signals ODT_L7 and ODT_L8, to output the latched signal as a corresponding intermediate control signal, e.g., the ninth and a tenth intermediate control signals ODT_L8 and ODT_L9, to the latency selection unit 130 in synchronization with the internal clock ICLK.

In accordance with a preferred embodiment of the present invention, the latency selection unit 130 can include a multiplexer. The latency selection unit 130 receives the first to the tenth intermediate control signals ODT_L0 to ODT_L9 outputted from the latency control unit 120 and selects one of them in response to the additive latency signal AL so as to output the selected one as the latency control signal ODT_AL.

Figure 4:
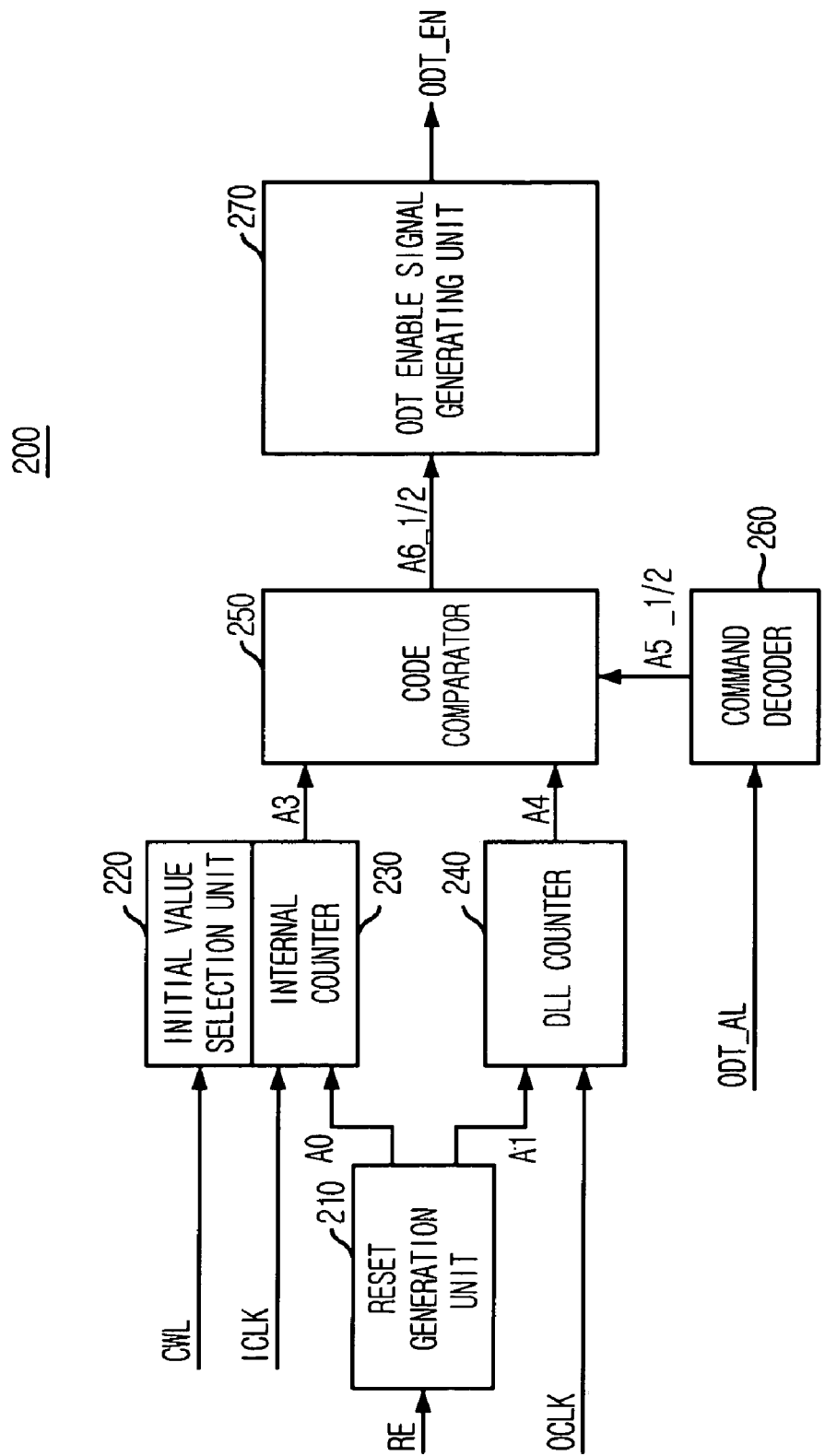
FIG. 4 is a detailed block diagram depicting an enable signal generation block shown in FIG. 2.

FIG. 4 is a detailed block diagram depicting the enable signal generation block 200 shown in FIG. 2.

The enable signal generation block 200 includes a reset generation unit 210, an initial value selection unit 220, an internal counter 230, a delay locked loop (DLL) counter 240, a code comparator 250, a command decoder 260 and an ODT enable signal generating unit 270.

The reset generation unit 210 receives the reset signal RE to output a first reset control signal A0 to the internal counter 230 and to output a second reset control signal A1 to the DLL counter 240. The first reset control signal A0 is generated by delaying the second reset control signal A1 for a predetermined time.

The initial value selection unit 220 receives the CAS latency signal CWL to set an initial value of the internal counter 230.

The internal counter 230 receives the internal clock ICLK to output a first count control signal A3 to the code comparator 250 by counting the internal clock ICLK in response to the first reset control signal A0. The internal clock ICLK is used as a sampling master clock and the first count control signal A3 is a binary code.

The DLL counter 240 receives the output clock OCLK to output a second count control signal A4 to the code comparator 250 by counting the output clock OCLK in response to the second reset control signal A1. The second count control signal A4 is also a binary code.

The command decoder 260 receives and decodes the latency control signal ODT_AL outputted from the latency selection unit 130 to output a decoding control signal A5_1/2 to the code comparator 250.

The code comparator 250 compares the first count control signal A3 with the second count control signal A4 in response to the decoding control signal A5_1/2 so as to output a code control signal A6_1/2 to the ODT enable signal generating unit 270. If a command for outputting a data is inputted, the code comparator 250 saves a binary code of the first count control signal A3 based on the internal clock ICLK corresponding the sampling master clock, and then, compares the binary code of the first count control signal A3 with a binary code of the second count control signal A4 based on the output clock OCLK, so as to output the code control signal A6_1/2 to the ODT enable signal generating unit 270.

Accordingly, the ODT enable signal generating unit 270 controls a point of activating the ODT enable signal ODT_EN in response to the code control signal A6_1/2.

Figure 5:
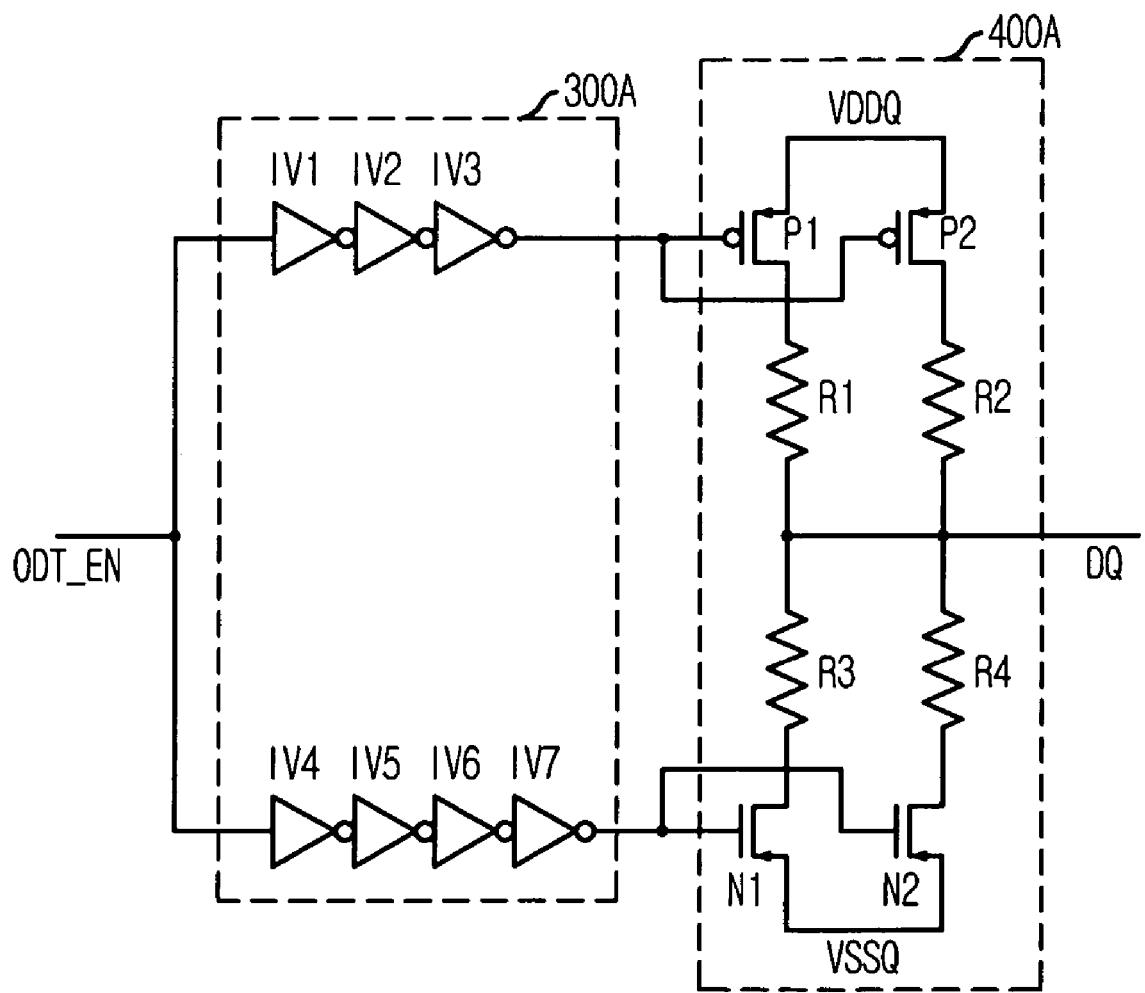
FIG. 5 is a detailed circuit diagram depicting a unit ODT block and a unit termination resistor block shown in FIG. 2.

FIG. 5 is a detailed circuit diagram depicting the first unit ODT block 300A and the first unit termination resistor block 400A shown in FIG. 2.

Other unit ODT blocks and unit termination resistor blocks have the same circuit structure as the first unit ODT block 300A and the first unit termination resistor block 400A, and thus the first unit ODT block 300A and the first unit termination resistor block 400A will be described as an exemplary structure.

The first unit ODT block 300A includes first to seventh inverters IV1 to IV7. The first unit termination resistor block 400A includes first and second PMOS transistors P1 and P2, first and second NMOS transistors N1 and N2, and first to fourth termination resistors R1 to R4.

The first to the third inverters IV1 to IV3 delay the ODT enable signal ODT_EN, by inverting, to output the delayed signal to gates of the first and the second PMOS transistors P1 and P2. The fourth to the seventh inverters IV4 to IV7 delay the ODT enable signal ODT_EN, without inverting, to output the delayed signal to gates of the first and the second NMOS transistors N1 and N2.

The first PMOS transistor P1 and the first NMOS transistor N1 correspond to the plural switches SW1 shown in FIG. 2, and the second PMOS transistor P2 and the second NMOS transistor N2 correspond to the plural switches SW2 shown in FIG. 2. The plural termination resistors R1 to R4 correspond to the plural termination resistors RTT shown in FIG. 2.

When the ODT enable signal is activated with a logic level 'HIGH' after a predetermined time, the first unit ODT block 300A selectively connects the plural termination resistors RTT to the power supply voltage terminal VDDQ or the ground voltage terminal VSSQ by using the plural switches SW1 and SW2 connected in parallel. As a result, it is possible to control the termination impedance of the ODT circuit.

Hereinafter, referring to FIGS. 2 to 5, an operation for controlling the termination impedance of the ODT circuit will be described.

Figure 6:
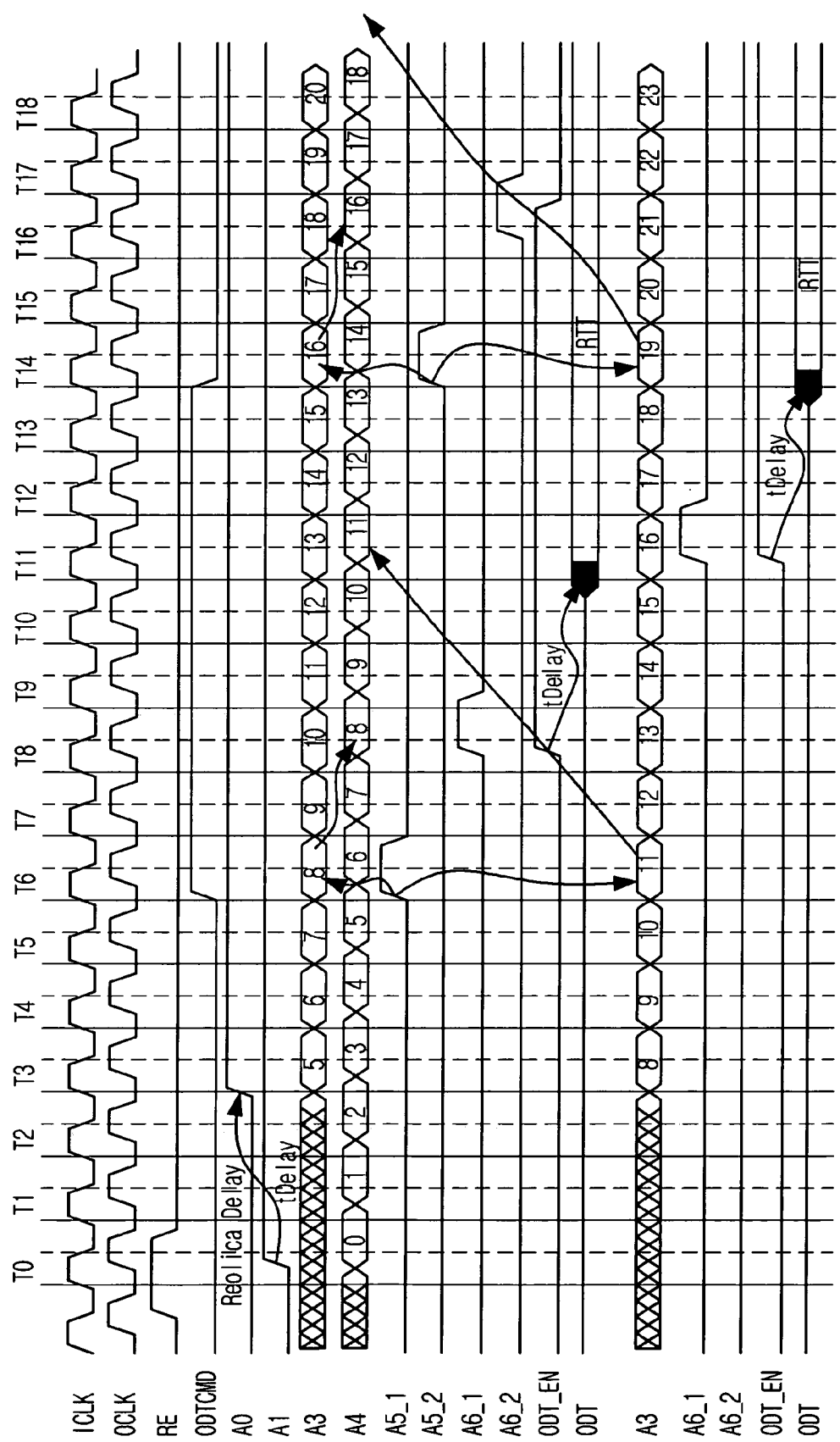
FIG. 6 is a timing diagram describing an operation of the ODT control device shown in FIG. 2.

FIG. 6 is a timing diagram describing an operation of the ODT control device shown in FIG. 2.

Data which determines a latency of the ODT circuit are linked with a write latency. For example, in a double data rate 3 (DDR3) memory device, the latency of the ODT circuit is set to a value as the sum of an additive latency signal AL and a CAS latency signal CWL. In this case, the ODT enable latency is determined as a value by subtracting 1.5 tCLK (clock period) from the sum of an additive latency signal AL and a CAS latency signal CWL, i.e., (AL+CWL−1.5 tCLK).

The ODT enable signal ODT_EN is controlled by using specific latency information such as the additive latency and the CAS latency so that it is possible to flexibly control an active period of the ODT circuit.

First, after the ODT control signal ODT is inputted to the ODT input buffer 110 via an ODT pin, the ODT input buffer 110 performs the buffering operation of the ODT control signal ODT so as to output the first intermediate control signal ODT_L0 to the latency control unit 120. In this time, the ODT input buffer 110 may output the first intermediate control signal ODT_L0 in synchronization with a chip selection signal CS.

Thereafter, the latency control unit 120 sequentially flip-flops the first intermediate control signal ODT_L0 so as to output the flip-flopped signal to the latency selection unit 130 in synchronization with the internal clock ICLK. In this time, the latency can be controlled by delaying the first intermediate control signal ODT_L0 based on the internal clock ICLK or by using a shift register or a counter.

The latency selection unit 130 selects one of the outputs of the latency control unit 120 based on the additive latency signal AL which is preset by a mode register set (MRS) to activate the latency control signal ODT_AL. If an ODT command with the latency is inputted, the latency control signal ODT_AL is operating in synchronization with the internal clock ICLK.

The code comparator 250 changes the first count control signal A3 synchronized with the internal clock ICLK for processing an internal command into the second count control signal A4 synchronized with the output clock OCLK for controlling an output operation, when the decoding control signal A5_1/2 outputted from the command decoder 260 is activated. When a domain of the internal clock ICLK which operates as the sampling master clock is changed into a domain of the DLL clock which operates as the output clock OCLK, the initial value of the internal counter 230 is adjusted according to the CAS latency signal CWL inputted to the initial value selection unit 220 so that new additional latency information may be added.

Referring to FIG. 6, the initial value of the internal counter 230 is adjusted according to the CAS latency signal CAS latency signal CWL.

In detail, if the initial value of the internal counter 230 is set to "5", the second reset control signal A1 is activated after a predetermined time from activating the reset signal RE. Accordingly, the DLL counter 240 activates the second count control signal A4 to output the activated signal to the code comparator 250 in synchronization with the output clock OCLK. In addition, when the first reset control signal A0 is activated after a predetermined time from activating the second reset control signal A1, the internal counter 230 activates the first count control signal A3 to output the activated signal to the code comparator 250 in synchronization with the internal clock ICLK. At this time, the initial code value of the first count control signal A3 is the preset value "5". Meanwhile, after activating the ODT command ODTCMD, the command decoder 260 activates the decoding control signal A5_1/2 to output the activated signal to the code comparator 250. Accordingly, the code control signal A6_1/2 is activated when code vales of the first and the second count control signal A3 and A4 are the same, i.e., "8". As a result, the ODT enable signal generating unit 270 can control a point of activating the ODT enable signal ODT_EN based on the code control signal A6_1/2.

Likewise, if the initial value of the internal counter 230 is set to "8", the second reset control signal A1 is activated after a predetermined time from activating the reset signal RE. Accordingly, the DLL counter 240 activates the second count control signal A4 to output the activated signal to the code comparator 250 in synchronization with the output clock OCLK. When the first reset control signal A0 is activated after a predetermined time from activating the second reset control signal A1, the internal counter 230 activates the first count control signal A3 to output the activated signal to the code comparator 250 in synchronization with the internal clock ICLK. At this time, the initial code value of the first count control signal A3 is the preset value "8". After activating the ODT command ODTCMD, the command decoder 260 activates the decoding control signal A5_1/2 to output the activated signal to the code comparator 250. Accordingly, the code control signal A6_1/2 is activated when code vales of the first and the second count control signal A3 and A4 are same, i.e., "11". As a result, the ODT enable signal generating unit 270 can control a point of activating the ODT enable signal ODT_EN based on the code control signal A6_1/2.

In accordance with the embodiment of the present invention, the ODT block 300 can be adjusted by controlling the point of activating the ODT enable signal ODT_EN.

The ODT control signal ODT is used for operating the ODT circuit. In another embodiment, it is possible to use a write command signal for operating the ODT circuit or use a read command signal for stopping an operation of the ODT circuit.

As described above, on die termination (ODT) control device of the present invention determines an active period of the ODT circuit by using latency information. As a result, it is possible to flexibly control a termination impedance of the ODT circuit.

The present application contains subject matter related to Korean patent application No. 2005-91520, filed in the Korean Patent Office on Sep. 29, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. An on die termination (ODT) control device, comprising:
   a latency block for buffering an ODT control signal to output a latency control signal by selecting one of a plurality of intermediate control signals, which are generated by sequentially delaying the buffered ODT control signal in synchronization with an internal clock, based on first latency information;
   an enable signal generation block for comparing a first control signal with a second control signal in response to the latency control signal to thereby produce an ODT enable signal based on the compared result; and
   an ODT block for controlling a termination impedance based on the ODT enable signal.

2. The ODT control device as recited in claim 1, wherein the first control signal is generated by counting the internal clock and using second latency information as an initial value.

3. The ODT control device as recited in claim 2, wherein the second control signal is generated by counting an external clock.

4. The ODT control device as recited in claim 3, wherein the first latency information includes an additive latency signal defining how many clocks are required from a point of loading a read command or a write command to a point of recognizing them during a read or a write operation.

5. The ODT control device as recited in claim 3, wherein the first latency information includes a write command signal.

6. The ODT control device as recited in claim 3, wherein the first latency information includes a signal which is preset by a mode register set (MRS).

7. The ODT control device as recited in claim 3, wherein the second latency information includes a column address strobe (CAS) latency signal which represents a waiting time of a CAS signal.

8. The ODT control device as recited in claim 3, wherein each of the first and the second control signals is a binary code.

9. The ODT control device as recited in claim 3, wherein the ODT block comprises:
 a plurality of unit termination resistor blocks, each unit termination resistor block including a plurality of switches and terminal resistors, for selectively connecting the terminal resistors to a power supply voltage terminal or a ground voltage terminal by using the switches connected in parallel; and
 a plurality of unit delaying blocks for delaying the ODT enable signal to control the plurality of switches provided in said each unit termination resistor block.

10. The ODT control device as recited in claim 9, wherein each of the plurality of switches comprises a plurality of PMOS transistors and NMOS transistors.

11. The ODT control device as recited in claim 10, wherein each of the plurality of unit delaying blocks comprises:
 a first delaying unit for delaying and inverting the ODT enable signal to output the delayed inverted ODT control signal to gates of the plurality of PMOS transistors; and
 a second delaying unit for delaying the ODT enable signal to output the delayed ODT control signal to gates of the plurality of NMOS transistors.

12. The ODT control device as recited in claim 11, wherein each of the first and the second delaying units comprises a plurality of inverters.

13. An on die termination (ODT) control device, comprising:
 a latency buffer coupled to an ODT control signal;
 a latency control circuit coupled to the latency buffer, the latency control circuit comprising a plurality of sequentially delayed outputs;
 a latency selection circuit coupled to the outputs of the latency control circuit and a latency information signal, one of the latency control unit outputs selected as a latency control signal output in response to a latency information signal;
 an enable signal generation circuit coupled to first and second control signals, an output of the enable signal generation circuit comprising an ODT enable signal output generated in accordance with the latency control signal; and
 a termination impedance control circuit coupled to the ODT enable signal output, wherein termination impedance is controlled in response to the ODT enable signal.

14. The ODT control device as recited in claim 13, wherein the latency control circuit comprises at least one D-flip flop.

15. The ODT control device as recited in claim 13, wherein the latency control circuit comprises at least one shift register.

16. The ODT control device as recited in claim 13, wherein the latency control circuit comprises a counter.

17. The ODT control device as recited in claim 13, wherein the latency selection circuit comprises a multiplexer.

18. The ODT control device as recited in claim 13, wherein the enable signal generation circuit comprises:
 an internal counter for outputting the first control signal by counting the internal clock;
 a delayed locked loop (DLL) counter for outputting the second control signal by counting the external clock;
 a command decoder for decoding the latency control signal to output a third control signal;
 a code comparator for comparing the first control signal with the second control signal in response to the third control signal so as to output a code control signal; and
 an ODT enable signal generating unit for producing the ODT enable signal based on the code control signal.

19. The ODT control device as recited in claim 18, wherein the enable signal generation circuit comprises an initial value selection unit for receiving the second latency information to set the initial value of the internal counter.

20. The ODT control device as recited in claim 18, wherein the enable signal generation unit comprises a reset generation unit for generating a first reset control signal to the internal counter and a second reset control signal to the DLL counter based on an inputted reset signal.

21. The ODT control device as recited in claim 20, wherein the first reset control signal is generated by delaying the second reset control signal for a predetermined time.

22. The ODT control device as recited in claim 18, wherein the code comparator changes a domain of the internal clock into a domain of the external clock while the third control signal is activated.

* * * * *